United States Patent [19]
Gorenz, Jr. et al.

[11] Patent Number: 5,398,169
[45] Date of Patent: Mar. 14, 1995

[54] MICROELECTRONIC PACKAGE COMPRISING METAL HOUSING GROUNDED TO BOARD EDGE

[75] Inventors: Harold J. Gorenz, Jr., Lisle, Ill.;
Gregory J. Funk, Delta, Canada

[73] Assignee: Motorola, Schaumburg, Ill.

[21] Appl. No.: 176,989

[22] Filed: Jan. 3, 1994

[51] Int. Cl.$^6$ .............. H05K 9/00; H01L 25/04; H04B 3/30
[52] U.S. Cl. .................. 361/818; 174/35 R; 174/35 GC; 257/728; 257/660; 307/91; 334/85
[58] Field of Search ............ 174/35 R, 35 GC, 35 TS, 174/51; 331/67; 334/85; 361/816, 818, 753, 799, 800, 212, 220; 439/108, 109, 607; 455/90; 257/659, 660, 728; 333/246, 247; 307/91

[56] References Cited
U.S. PATENT DOCUMENTS

| | | | |
|---|---|---|---|
| 4,404,617 | 9/1983 | Ohyama et al. | 361/818 |
| 5,014,160 | 5/1991 | McCoy, Jr. | 361/818 |

FOREIGN PATENT DOCUMENTS

| | | | |
|---|---|---|---|
| 2-253698 | 10/1990 | Japan | 361/818 |
| 3-185795 | 8/1991 | Japan | 361/799 |
| 4-179195 | 6/1992 | Japan | 361/753 |
| 4-188793 | 7/1992 | Japan | 361/800 |

Primary Examiner—Leo P. Picard
Assistant Examiner—Donald A. Sparks
Attorney, Agent, or Firm—Douglas D. Fekete

[57] ABSTRACT

A microelectronic package (10) comprises a printed circuit board (12) enclosed within a metal housing (14) for shielding the board from spurious electromagnetic signals. The housing includes a base (30) having side walls (36). A series of first tabs (42) are formed in the side walls and engage the upper face (16) of the printed circuit board to secure the board within the housing. The side walls also include a series of second tabs (46) that engage the edge (20) of the printed circuit board in contact with the ground plane to enhance grounding of the housing.

3 Claims, 1 Drawing Sheet

MICROELECTRONIC PACKAGE COMPRISING METAL HOUSING GROUNDED TO BOARD EDGE

BACKGROUND OF THE INVENTION

This invention relates to a microelectronic package comprising a printed circuit board enclosed within a metal housing. More particularly, this invention relates to such microelectronic package wherein the metal housing includes side walls having integral tabs that secure the board and ground the housing to the board to shield the board from spurious radio frequency signals.

A common microelectronic package comprises a printed circuit board enclosed within a metal housing. Electronic components are mounted on a top, or first, face of the board and connected to a circuit trace to carry out desired electrical operations. Ground connections to the components are made to a metal layer submerged below the board face, referred to as a ground plane. Depending upon the particular board design, the ground plane may also may wrap around the edge of the printed circuit board and extend to the lower face.

The metal housing forms a radio frequency shield, which is more commonly referred to as an RF shield. The housing surrounds the printed circuit board and protects against ambient radio frequency signals that would otherwise create noise in the electrical signals processed by the board. Also, the metal housing contains radio frequency emissions by the board that might otherwise interfere with nearby electronic devices. For these purposes, the board is connected to the ground plane of the board. Optimum grounding is obtained by a multiplicity of connections spaced periodically about the board. The art provides many designs for such metal housings, commonly utilizing fasteners such as screws. Nevertheless, there remains a need for an improved metal housing into which the printed circuit board may be readily and securely assembled and which provides a reliable contact to the ground plane.

BRIEF DESCRIPTION OF THE DRAWINGS

The present invention will be further illustrated with reference to the accompanying drawings wherein.

DETAILED DESCRIPTION OF THE INVENTION

Figure 1:
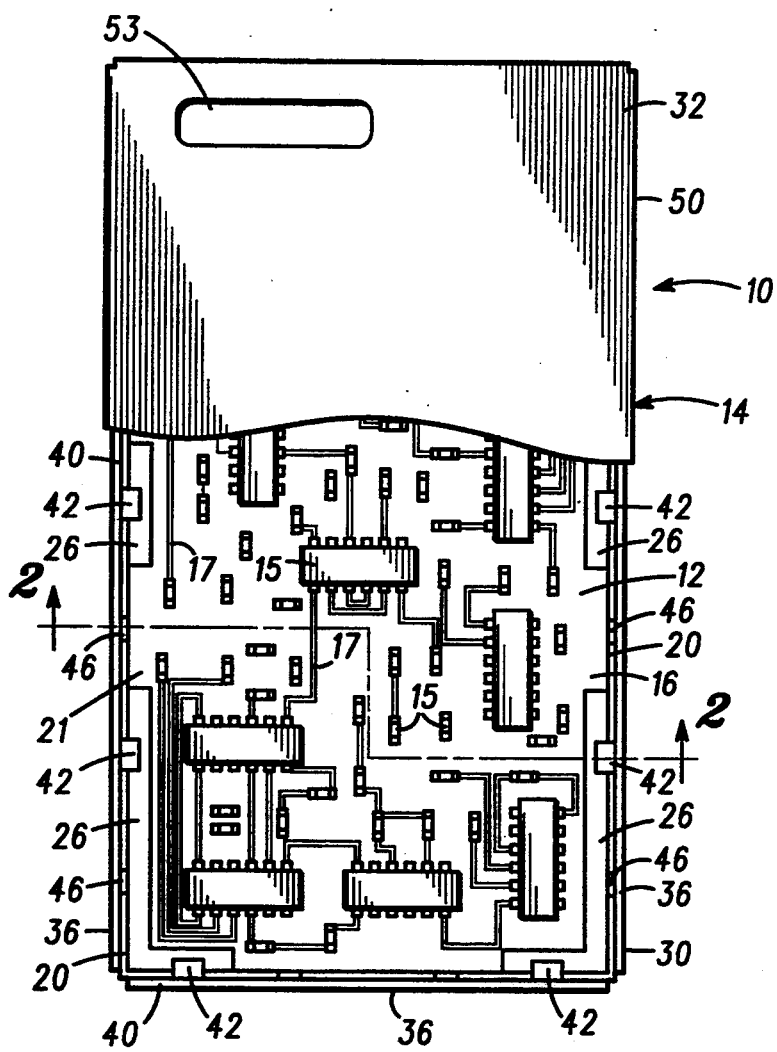
FIG. 1 is an elevational view of a microelectronic package including a metal housing in accordance with this invention.
Figure 3:
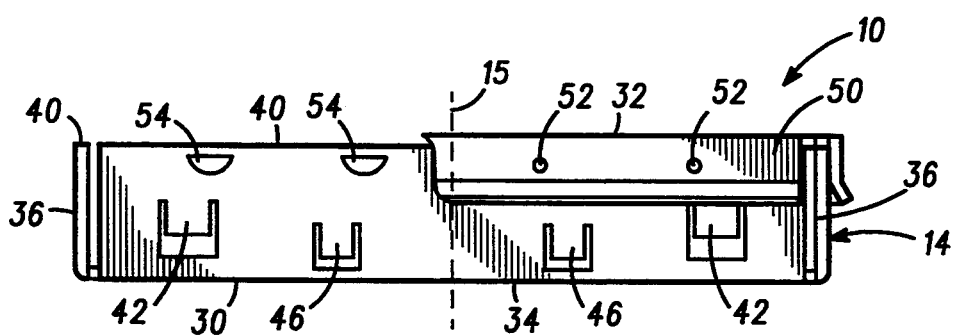
FIG. 3 is a plan view of the microelectronic package in FIG. 1 showing a side thereof.
Figure 2:
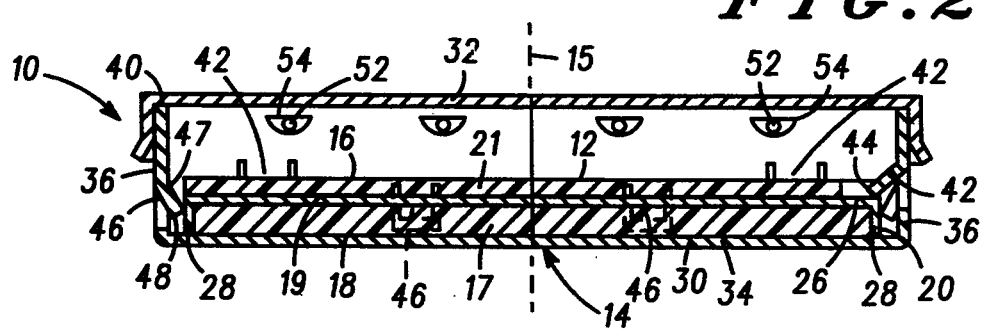
FIG. 2 is a cross-sectional view of the microelectronic package in FIG. 1, taken along line 2—2 in the direction of the arrows.

In accordance with a preferred embodiment of this invention, referring to FIGS. 1 through 3, a microelectronic package 10 comprises a printed circuit board 12 enclosed within a metal housing 14 that forms an RF (radio frequency) shield.

Printed circuit board 12 is of a conventional design adapted to carry out desired electrical operations. Board 12 features a generally planar, rectangular structure and has an axis 15 perpendicular to the board. Board 12 includes a first or upper face 16, a second or lower face 18 and a perimeter edge 20. A common printed circuit board 12 is formed of a glass fiber-epoxy substrate 17 onto which metal and dielectric layers are applied. Electronic components 15, such as integrated circuit modules or discrete electrical elements, are mounted onto upper face 16 and interconnected through a metal circuit trace 17 applied to the board, which trace and components are shown illustratively in FIG. 1, but are omitted from FIG. 2 for clarity. Of significance to the present embodiment, board 12 includes an electrical ground plane 19 that is generally covered by an insulative coating 21, but is exposed at the upper face to provide upper face contacts 26 adjacent to the perimeter. In addition, the ground plane wraps around edge 20 and is exposed along the edge to provide edge contacts 28.

Metal housing 14 comprises a base member 30 and a cover member 32, separately formed of stamped metal sheet. Base member 30 comprises a bottom panel 34 and integrally connected sides 36 that cooperate to define a compartment 38 for securely receiving printed circuit board 12. Referring to FIG. 2, bottom panel 34 overlies lower face 18 of printed circuit board 12 and is substantially coextensive therewith. A polymeric sheet may be interposed between panel 34 and board face 18 to insulate any electrical features on the board face. Sides 36 are integrally connected to panel 34 and are axially disposed about edge 20 of board 12. Each side 36 includes an uppermost rim 40 remote from panel 34 that define an open top for the base. Of particular significance to the present invention, a plurality of first tabs 42 are formed in sides 36 and protrude inboard. Each tab 42 includes an inner surface 43 that merges continuously from the side wall and an end 44. Ends 44 engage upper board face 16 at contacts 26 and are biased to urge the board against panel 34. Sides 36 also include a plurality of second tabs 46 that are integral formed with the wall and protrude inward. Each tab 46 comprises an inner surface 47 that merges continuously with the adjacent side wall and an end 48 that engages board edge 20 at contact 28. It is pointed out that tab ends 44 lie in a plane that corresponds to the plane of upper face 16 and is spaced apart from panel 34 by a distance corresponding to the width of the board. In comparison, tab ends 48 lie intermediate panel 34 and ends 44 and are spaced apart from panel 34 by a distance that is less than the thickness of the board.

For assembly, printed circuit board 12 is inserted axially into base 30 through the open top to rest against panel 34. As the board 12 is advanced toward panel 34, the board slides along the inner surfaces of tabs 42 and 46. Passage to the board is accommodated by the deflection of sides 36, as well as tabs 42 and 46. The board is pressed against the panel, causing slight compression of the board that provides clearance to permit ends 44 to spring into position overlying board face 16, so that upon release ends 44 engage the board face and lock the board into position against the panel. Ends 48 of tabs 46 do not clear upper face 16 and are biased against edge 20 to urge board 12 laterally into position and to produce intimate contact between tabs 46 and contacts 28.

Cover member 32 is assembled to base member 30 to close housing 14. Cover 32 includes dependent sides 50 disposed outboard of sides 36 of base member 30. Sides 50 includes dimples 52 that are received into corresponding holes 54 formed in sides 36 adjacent rim 40 lock cover member 30 onto base member 32. Electrical connections to the board are made through an opening 53 in cover 32.

If desired, for example, for purposes of repair or replacement, board 12 may be readily removed from housing 14. Cover 32 is removed by prying sides 50 apart from sides 36 of base 30 to withdraw dimples 52 from holes 54. Thereafter, board 12 is freed from base 30 by a combination of slight compression of the board and outward deflection of sides 36.

Therefore, in the preferred embodiment, the microelectronic package of this invention comprises a printed circuit board that is completely enclosed within a metal housing that physically protects the board from damage and includes numerous connections to the ground plane of the board to enhance RF shielding provided by the housing. The housing includes a base member and a cover to surround the board in all directions to intercept spurious radio frequency signals that would otherwise tend to interfere with the processing of electrical signals by the board, as well as to block emissions of radio frequency signals from the board that might otherwise adversely affect nearby electrical devices. The base of the housing comprises a series of first tabs that engage the upper face of the board and a series of second tabs that engage the edge of the board. The first tabs urge the printed circuit board against the bottom panel of the base member to secure the board in position. Preferably, the first tabs contact exposed regions of the ground plane. However, because of warpage of the board, contamination of the upper face or other factors that might interfere with electrical connection between the board and the first tabs, the second tabs engage the ground plane at the edge of the printed circuit board and assure reliable connections. The housing is advantageously fabricated by stamping the base and cover from metal sheet, with the additional advantage that the tabs and other features may be concurrently formed in a single stamping operation. Furthermore, the printed circuit board may be readily removed from the housing in the event repair or replacement becomes necessary.

While this invention has been described in terms of certain embodiments thereof, it is not intended that it be limited to the above description but rather only to the extent set forth in the claims that follow.

The embodiments of the invention in which an exclusive property or privilege is claimed are defined as follows:

1. A microelectronic package comprising
   a printed circuit board comprising a first board face for mounting components thereon, a second board face opposite the first board face and a board edge extending between the first and second board faces, and
   a metal housing enclosing the printed circuit board and comprising a base member defining an open-top compartment for receiving the printed circuit board, said base member comprising
   a panel overlying the second board face and substantially coextensive therewith, and
   at least one side wall extending integrally from the panel about the board edge and comprising at least one first tab and at least one second tab, said first and second tabs being integrally connected to the side walls and protruding inboard in the direction of the panel, said first tab comprising an end engaging the first board face to urge the printed circuit board against the panel, said second tab comprising an end engaging the board edge.

2. A microelectronic package comprising
   a printed circuit board having a generally planar structure and comprising a first board face for mounting components thereon, a second board face opposite the first board face and a board edge extending between the first and second board faces, said printed circuit board further comprising an electrical ground plane including an exposed region at the board edge, and
   a metal housing enclosing the printed circuit board and comprising a base member defining an open-top compartment for receiving the printed circuit board and a cover member attached to the base member for closing the compartment, said base member comprising
   a panel overlying the second board face and substantially coextensive therewith, and
   at least one side wall extending integrally from the panel about the board edge and comprising a rim remote from the panel, said side wall comprising at least one first tab and at least one second tab, said first and second tabs being integrally connected to the side walls and protruding inboard in the direction of the panel, said first tab comprising an end engaging the first board face to urge the printed circuit board against the panel, said second tab comprising an end engaging the exposed region to electrical connect the housing to the electrical ground plane for shielding radio frequency radiation.

3. A microelectronic package comprising
   a printed circuit board having a generally planar structure and comprising a first board face for mounting components thereon, a second board face opposite the first board face and a board edge extending between the first and second board faces, said printed circuit board further comprising an electrical ground plane comprising a first contact region at the board face adjacent the board first edge and a second contact region at the board edge, and
   a metal housing enclosing the printed circuit board and comprising a base member defining an open-top compartment for receiving the printed circuit board and a cover member attached to the base member for closing the compartment, said base member comprising
   a panel overlying the second board face and substantially coextensive therewith, and
   at least one side wall extending integrally from the panel and comprising a rim remote from the panel, said side wall comprising at least one first tab and at least one second tab, said first and second tabs being integrally connected to the side walls and protruding inboard in a direction toward the panel, said first tab comprising an end engaging the first contact region, said second tab comprising an end engaging the second contact region whereby said first and second tabs position the printed circuit board within the compartment and concurrently electrically connect the metal housing to the electrical ground plane for shielding the printed circuit board from radio frequency radiation.

* * * * *